(12) United States Patent
Kumano et al.

(10) Patent No.: US 10,374,132 B2
(45) Date of Patent: Aug. 6, 2019

(54) LIGHT EMITTING DEVICE USING WAVELENGTH CONVERSION MEMBER, METHOD OF MANUFACTURING WAVELENGTH CONVERSION MEMBER, AND METHOD OF MANUFACTURING LIGHT EMITTING DEVICE

(71) Applicant: NICHIA CORPORATION, Anan-shi, Tokushima (JP)

(72) Inventors: Masami Kumano, Tokushima (JP); Yuji Sato, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 251 days.

(21) Appl. No.: 15/386,071

(22) Filed: Dec. 21, 2016

(65) Prior Publication Data

US 2017/0186920 A1     Jun. 29, 2017

(30) Foreign Application Priority Data

Dec. 24, 2015  (JP) .................................. 2015-251130

(51) Int. Cl.
*H01L 21/00* (2006.01)
*H01L 33/50* (2010.01)
*H01L 33/60* (2010.01)

(52) U.S. Cl.
CPC ............ *H01L 33/502* (2013.01); *H01L 33/60* (2013.01); *H01L 2933/0041* (2013.01); *H01L 2933/0058* (2013.01)

(58) Field of Classification Search
CPC .......... H01L 33/50–33/508; H01L 2933/0041; H01L 2933/0058;
(Continued)

(56) References Cited

U.S. PATENT DOCUMENTS 7,075,116 B2 * 7/2006 Okazaki ................ H01L 33/504
257/100
7,635,873 B2 * 12/2009 Harada ................. H01L 33/508
257/95

(Continued)

FOREIGN PATENT DOCUMENTS

JP     2002-141559 A     5/2002
JP     2003-101074 A     4/2003
(Continued)

*Primary Examiner* — Kevin M Picardat
(74) *Attorney, Agent, or Firm* — Hunton Andrews Kurth LLP

(57) ABSTRACT

A method of manufacturing a wavelength conversion member with improved capability of releasing heat from a fluorescent material is provided. The method of manufacturing the wavelength conversion member includes: disposing a fluorescent material paste containing a fluorescent material and a binder on a surface of a light-transmissive body; orienting face-down the surface where the fluorescent material paste is disposed, to settle the fluorescent material in the fluorescent material paste on a side opposite to another side of the fluorescent material paste, the another side being in contact with the light-transmissive body; and curing the binder in a state where the fluorescent material has been settled, to form a fluorescent material layer.

8 Claims, 3 Drawing Sheets

(58) Field of Classification Search
 CPC ............... H01L 51/5262–51/5284; H01L
 51/5253–51/5256
 USPC ............................................ 257/98
 See application file for complete search history.

(56) References Cited

U.S. PATENT DOCUMENTS

| | | | | |
|---|---|---|---|---|
| 7,876,036 | B2* | 1/2011 | Taguchi | H01L 33/501 |
| | | | | 313/502 |
| 8,288,936 | B2* | 10/2012 | Ohta | C09K 11/02 |
| | | | | 313/503 |
| 9,070,845 | B2* | 6/2015 | Kim | H01L 25/0753 |
| 9,093,623 | B2* | 7/2015 | Petry | H01L 33/56 |
| 2003/0080341 | A1* | 5/2003 | Sakano | B29C 67/08 |
| | | | | 257/79 |
| 2005/0224818 | A1* | 10/2005 | Harada | H01L 33/508 |
| | | | | 257/79 |
| 2010/0224893 | A1 | 9/2010 | Liepold | |
| 2011/0309388 | A1 | 12/2011 | Ito et al. | |
| 2012/0140506 | A1 | 6/2012 | Waragawa et al. | |
| 2012/0236582 | A1 | 9/2012 | Waragaya et al. | |
| 2014/0028173 | A1* | 1/2014 | Tsuchiya | F21V 29/004 |
| | | | | 313/46 |
| 2014/0131753 | A1 | 5/2014 | Ishida et al. | |
| 2015/0200339 | A1* | 7/2015 | Markytan | H01L 33/505 |
| | | | | 257/98 |
| 2015/0340577 | A1 | 11/2015 | Ishida et al. | |
| 2016/0027971 | A1* | 1/2016 | Anc | C09K 11/025 |
| | | | | 257/98 |

FOREIGN PATENT DOCUMENTS

| | | |
|---|---|---|
| JP | 2007227791 A | 9/2007 |
| JP | 2009-218274 A | 9/2009 |
| JP | 2009540551 A | 11/2009 |
| JP | 2011-233552 A | 11/2011 |
| JP | 2012-156180 A | 8/2012 |
| JP | 2013-077679 A | 4/2013 |
| JP | 2013232484 A | 11/2013 |
| JP | 2014-041993 A | 3/2014 |
| JP | 2014120722 A | 6/2014 |
| JP | 2015-524620 A | 8/2015 |

\* cited by examiner

LIGHT EMITTING DEVICE USING WAVELENGTH CONVERSION MEMBER, METHOD OF MANUFACTURING WAVELENGTH CONVERSION MEMBER, AND METHOD OF MANUFACTURING LIGHT EMITTING DEVICE

CROSS-REFERENCE TO RELATED APPLICATION

This application claims the benefit of Japanese Patent Application No. 2015-251130, filed on Dec. 24, 2015. The entire disclosure of Japanese Patent Application No. 2015-251130 is incorporated by reference herein.

BACKGROUND

Technical Field

The present disclosure relates to a light emitting device including a wavelength conversion member, a method of manufacturing the wavelength conversion member, and a method of manufacturing the light emitting device.

Description of Related Art

In recent years, developments are being made in a package which is substantially equivalent to a light emitting element in size, i.e., a so-called Chip Scale Package (CSP), as a small-size light emitting device using a light emitting diode (LED).

As an example of such a light emitting device, a light emitting device including a wavelength conversion member has been proposed. For example, a light emitting device disclosed in JP 2009-218274 A includes a light emitting element disposed on a substrate, and a plate-like wavelength conversion member disposed on the light emitting element. For example, a binder previously formed to be plate-like is used as the wavelength conversion member, in which binder a fluorescent material is dispersed.

However, since such a wavelength conversion member contains a binder of low thermal conductivity, the wavelength conversion member may fail to fully release heat from the fluorescent material. For example, in order to ensure mechanical strength of the wavelength conversion member in manufacturing processes of the light emitting device, the amount of resin contained in the wavelength conversion member inevitably becomes relatively large. As a result, heat is not fully released from the fluorescent material that emits light. A fluorescent material being susceptible to heat can only emit weak light when deteriorated. This invites chromaticity shift in the light emitting device. Further, heat emitted from the fluorescent material may crack the binder. The cracked binder disadvantageously influences the optical characteristic of the light emitting device.

Accordingly, an object of the present disclosure is to provide a light emitting device that solves the problem described above and includes a wavelength conversion member with improved capability of releasing heat from a fluorescent material, a method of manufacturing the wavelength conversion member, and a method of manufacturing the light emitting device.

SUMMARY

A method of manufacturing a wavelength conversion member according to an embodiment of the present disclosure includes: disposing a fluorescent material paste containing a fluorescent material and a binder on a surface of a light-transmissive body; orienting face-down the surface where the fluorescent material paste is disposed, to settle the fluorescent material in the fluorescent material paste on a side opposite to another side of the fluorescent material paste, the another side being in contact with the light-transmissive body; and curing the binder in a state where the fluorescent material has been settled, to form a fluorescent material layer.

A light emitting device according to an embodiment of the present disclosure includes a substrate, a light emitting element disposed on the substrate, and a wavelength conversion member disposed on the light emitting element. The wavelength conversion member includes a light-transmissive body and a fluorescent material layer formed on a surface of the light-transmissive body. The surface of the light-transmissive body opposes to the light emitting element. The fluorescent material layer contains resin and a fluorescent material disposed in the resin. A concentration of the fluorescent material in the fluorescent material layer is higher on a side near the light emitting element than on another side near the light-transmissive body in a direction perpendicular to the surface of the light-transmissive body, and the concentration is substantially uniform in a direction parallel to the surface of the light-transmissive body.

An embodiment of the present disclosure provides a light emitting device that includes a wavelength conversion member with improved capability of releasing heat from a fluorescent material. This suppresses deterioration of a fluorescent material being susceptible heat, and consequently chromaticity shift in the light emitting device reduces. Further, since heat emission of the fluorescent material becomes less prone to disadvantageously influence the binder, a light emitting device with an excellent optical characteristic can be obtained. Still further, a method of manufacturing such a wavelength conversion member and a method of manufacturing a light emitting device including the wavelength conversion member are provided.

DETAILED DESCRIPTION

Figure 1:
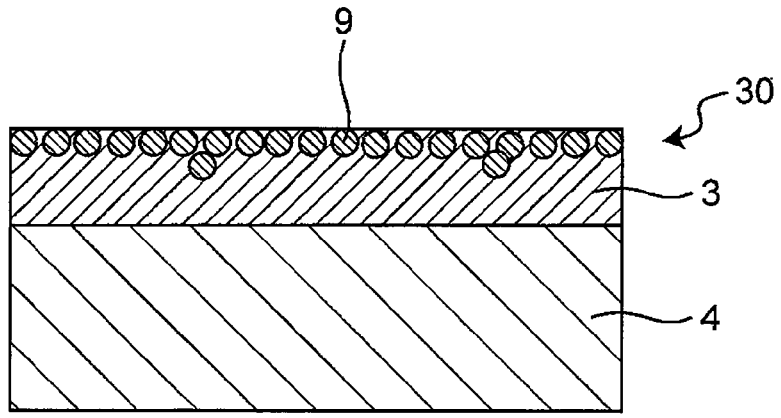
FIG. 1 is a schematic cross-sectional view of a wavelength conversion member according to an embodiment of the present disclosure.

In the following, with reference to the drawings, a detailed description will be given of embodiments of the present disclosure. Note that, those denoted by identical reference characters in a plurality of drawings are identical or similar portions or members.

Further, the embodiments shown in the following illustrate a wavelength conversion member, a light emitting device, a method of manufacturing the wavelength conversion member, and a method of manufacturing the light emitting device for embodying the technical idea of the present invention, and are not intended to limit the present invention to the embodiments. Dimensions, materials, shapes, relative positions and the like of the constituents described in the embodiments are not intended to limit the scope of the present invention thereto unless otherwise specified, and intended to be of an illustrative nature. Sizes or positional relationships of members shown in the drawings may be exaggerated for the purpose of facilitating understanding.

In order to solve the above-described problem, the inventors of the present invention have conducted thorough study and found that a wavelength conversion member with improved capability of releasing heat from a fluorescent material can be obtained in the following structure. That is, a wavelength conversion member is formed by a light-transmissive body and a fluorescent material layer disposed on the light-transmissive body. In the fluorescent material layer formed on a main surface of the light-transmissive body which main surface opposes to a light emitting element, a concentration of the fluorescent material is set to be higher on a side near the light emitting element than on a side near the light-transmissive body in the direction perpendicular to the main surface.

By disposing, in the fluorescent material layer, the fluorescent material in a greater amount on the side far from the light-transmissive body, that is, on the side near the light emitting element, heat of the fluorescent material can be efficiently released from the light emitting element side of the fluorescent material layer, as compared to the case where the fluorescent material is evenly distributed in the fluorescent material layer. Further, by setting the concentration of the fluorescent material to be substantially uniform in the direction parallel to the main surface, wavelength conversion by the fluorescent material is carried out substantially evenly in every direction, contributing to reducing chromaticity shift in the light emitting device.

The inventors of the present invention have found a method of obtaining a wavelength conversion member including a fluorescent material layer having such a fluorescent material concentration distribution.

A fluorescent material paste containing a fluorescent material and a binder is disposed on one main surface of a light-transmissive body. To the particles of the fluorescent material contained in the fluorescent material paste, external force is applied in the direction opposite to the surface where the fluorescent material paste is in contact with the light-transmissive body. For example, the light-transmissive body on which the fluorescent material paste is disposed is turned over, so that the main surface where the fluorescent material paste is disposed is turned upside down, preferably, so as to be oriented in the gravity direction. Thus, the fluorescent material in the fluorescent material paste is naturally settled on the side opposite to the surface in contact with the light-transmissive body (that is, the side nearer to the light emitting element in the light emitting device). After the fluorescent material concentration distribution as described above is obtained in this manner, the binder is cured and a fluorescent material layer is formed.

In the following, a detailed description will be given of embodiments of the present disclosure.

1. Wavelength Conversion Member

Figure 2:
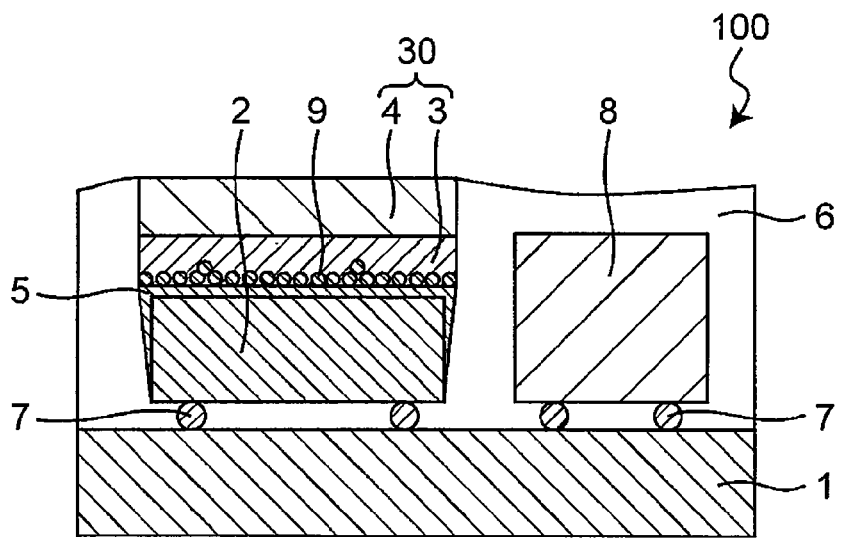
FIG. 2 is a schematic cross-sectional view of a light emitting device including the wavelength conversion member according to an embodiment of the present disclosure.

FIG. 1 is a schematic cross-sectional view of a wavelength conversion member 30 according to an embodiment of the present disclosure. FIG. 2 is a schematic cross-sectional view of a light emitting device 100 including the wavelength conversion member 30 according to an embodiment of the present disclosure. As shown in FIGS. 1 and 2, the wavelength conversion member 30 has a light-transmissive body 4, and a fluorescent material layer 3 which is formed on one of main surfaces of the light-transmissive body 4 (the main surface that opposes to a light emitting element 2 when light emitting device 100 is structured with the wavelength conversion member 30). The fluorescent material layer 3 contains resin and a fluorescent material 9 disposed in the resin.

In the fluorescent material layer 3, in the direction perpendicular to the main surface of the light-transmissive body 4 (the main surface where the fluorescent material layer 3 is formed), the concentration of the fluorescent material 9 is higher on the side far from the light-transmissive body 4, that is, on the side near the light emitting element 2, than on the side near the light-transmissive body 4, when the fluorescent material layer 3 is mounted on the light emitting device 100 which will be described later.

Since the light-transmissive body 4 is formed by a light-transmissive material of low thermal conductivity such as glass or resin, heat from the fluorescent material 9 positioned on the light-transmissive body 4 side among the fluorescent material 9 contained in the fluorescent material layer 3 is not easily released. On the other hand, heat from fluorescent material 9 positioned on the opposite side of the light-transmissive body 4 (on the side facing the light emitting element 2 in the light emitting device 100) is released easier as compared to the fluorescent material 9 positioned on the light-transmissive body 4 side.

From the foregoing, heat generated by wavelength conversion of the fluorescent material is easily released. Such an improvement in releasing heat from a fluorescent material being susceptible to heat suppresses deterioration of the fluorescent material, and consequently chromaticity shift in the light emitting device reduces. Further, since heat emission of the fluorescent material becomes less prone to disadvantageously influence the binder, any damage that may be done to the binder is avoided, and the light emitting device with an excellent optical characteristic is obtained.

Further, the concentration of the fluorescent material 9 is substantially uniform in the direction parallel to the main surface of the light-transmissive body 4 (the main surface where the fluorescent material layer 3 is formed). In this manner, achieving a uniform concentration of the fluorescent material 9 in the direction parallel to the main surface reduces chromaticity shift in light output from the fluorescent material layer 3 into the light-transmissive body 4, that is, light that is output from the light emitting element 2 and transmits through fluorescent material layer 3 keeping its wavelength intact and light that is output from the light emitting element 2 and has its wavelength converted by the fluorescent material 9. In particular, in the case where a region in which the fluorescent material concentration is high is formed on the side near the light emitting element 2 in the perpendicular direction as described above, and additionally a diffusing agent which will be described later is contained in the fluorescent material layer 3, light distribution chromaticity shift can also be reduced, as compared to the case where the fluorescent material of an equal amount is dispersed relatively evenly in the perpendicular direction. Further, when the diffusing agent is contained in the fluorescent material layer 3, generally the luminous flux of the light emitting device reduces. On the contrary, the concentration of the fluorescent material 9 in the fluorescent material layer 3 according to an embodiment of the present disclosure being higher on the side near the light emitting element 2 as described above also prevents such a reduction in luminous flux of the light emitting device.

Here, the concentration of the fluorescent material being "substantially uniform" means that the values of concentration measured at a plurality of points fall within a range of 30% above or below the average of the values.

Further, the concentration of the fluorescent material 9 can be obtained through observation of the cross section of the fluorescent material layer 3 using an optical microscope or an SEM. That is, the concentration of the fluorescent material 9 can be measured by counting the number of particles of the fluorescent material 9 observed in a predetermined region in the cross section.

The fluorescent material concentration being higher on the side far from the light-transmissive body 4 than on the side near the light-transmissive body 4 can be checked by: dividing the fluorescent material layer 3 into two equal parts in the direction perpendicular to the main surface; and comparing the fluorescent material concentration in one of the regions on the side near the light-transmissive body 4 and the fluorescent material concentration in other one of the regions on the side far from the light-transmissive body 4 (the region near the light emitting element 2) against each other. The fluorescent material concentration of the region on the side near the light-transmissive body 4 is preferably at least 1.5 times, more preferably at least 2.0 times as great as the fluorescent material concentration of the region on the side far from the light-transmissive body 4.

On the other hand, the concentration of the fluorescent material 9 being substantially uniform in a direction parallel to the main surface of the light-transmissive body 4 can be checked by: dividing the fluorescent material layer 3 into plurality of equal parts (e.g., five regions) in the direction parallel to the main surface; measuring the fluorescent material concentrations in respective regions; and comparing the average concentration of all the regions and the concentration of each region against each other.

2. Light Emitting Device

Next, a detailed description will be given of the light emitting device 100 including the wavelength conversion member 30.

The light emitting device 100 includes a substrate 1, the light emitting element 2 mounted on the substrate 1, and the wavelength conversion member 30 (including the fluorescent material layer 3 and the light-transmissive body 4) disposed at the light emitting element 2. The light emitting element 2 may be flip-chip mounted on the substrate 1 via an electrically conductive member 7. Further, the wavelength conversion member 30 may be joined to the light emitting element 2 via an adhesive layer 5. Further, the light emitting device 100 may include a light reflecting member 6 disposed along respective lateral surfaces of the light emitting element 2, the fluorescent material layer 3, and the light-transmissive body 4.

The light emitting device 100 may further include a semiconductor element 8 that is flip-chip mounted on the substrate 1 via the electrically conductive member 7. The semiconductor element 8 may be dispensed with as necessary.

The area of the fluorescent material layer 3 (the area of the main surface opposing to the light emitting element 2) may be as great as the area of the upper surface of the light emitting element 2. However, taking into consideration of the mount precision in manufacturing processes, when the fluorescent material layer 3 has the area as great as the area of the upper surface of the light emitting element 2, the upper surface of the light emitting element 2 may partially fail to be covered with the fluorescent material layer 3. Accordingly, in order to surely dispose the fluorescent material layer 3 over the entire upper surface of the light emitting element 2, the area of the fluorescent material layer 3 (as necessary, also the area of the light-transmissive body 4 (the area of the main surface where the fluorescent material layer 3 is formed)) is preferably greater than the area of the upper surface of the light emitting element 2. In this case, the fluorescent material layer 3 may be disposed at the light emitting element 2 so as to have an exposed portion which is not covered with the upper surface of the light emitting element 2 at part of its surface bonded to the light emitting element 2.

In the following, a detailed description will be given of elements of the light emitting device 100.

(Substrate)

The substrate 1 is a member for the light emitting element 2 to be disposed, and has wiring for electrically connecting between the electrodes of the light emitting element 2 and an external electrode. The main material of the substrate 1 is preferably an insulating material which is less prone to transmit light from the light emitting element 2 and external light. For example, the material may be ceramic such as alumina and aluminum nitride, or resin such as phenolic resin, epoxy resin, polyimide resin, BT resin, and polyphtalamide. Note that, in the case where resin is used, inorganic filler such as glass fiber, silicon oxide, titanium oxide, and alumina may be mixed with the resin. This improves the mechanical strength, reduces thermal expansion coefficient, and improves light reflectivity. The wiring is formed in a predetermined pattern on the insulating material. The material of the wiring may be at least one selected from gold, silver, copper and aluminum. The wiring may be formed by any appropriately selected method including metal plating, and disposition of metal foil.

(Light Emitting Element)

The light emitting element 2 is preferably a light emitting diode, and a light emitting diode of any wavelength can be selected in accordance with the intended use. For example, it may be a blue-color light emitting element that uses a nitride semiconductor ($In_XAl_YGa_{1-X-Y}N$, $0 \leq X$, $0 \leq Y$, $X+Y \leq 1$) capable of emitting light of short wavelength with which the fluorescent material 9 is efficiently excited. The light emission wavelength can be selected by the variation of materials and mixed crystal ratios of the semiconductor layer.

(Fluorescent Material Layer)

The fluorescent material layer 3 contains the fluorescent material that absorbs at least part of light from light emitting element 2 and emits light of different wavelength. The fluorescent material layer 3 may be formed by the fluorescent material mixed with a light-transmissive material such as resin, glass, and an inorganic substance as a binder of the fluorescent material. Of these, use of resin as the binder is preferable for its workability. The fluorescent material layer 3 may be formed as a single layer including one type of fluorescent material, a single layer including mixture of two or more types of fluorescent materials, or stacked layers of such single layers.

Note that, a diffusing agent may be added to the fluorescent material layer 3 as necessary. When the fluorescent material layer 3 contains a diffusing agent, while the concentration of the fluorescent material is varied, the diffusing agent can be substantially evenly distributed from the side near the light-transmissive body 4 to the side near the light emitting element 2, in the direction perpendicular to the main surface of the light-transmissive body 4 where the fluorescent material layer 3 is formed. Here, the concentration of the diffusing agent being "substantially even" means that, in the fluorescent material layer 3 being divided into two equal parts in the direction perpendicular to the main surface of the light-transmissive body 4 where the fluorescent material layer 3 is formed, the difference between the concentration of the diffusing agent in the region near the light-transmissive body 4 and the concentration of the diffusing agent in the region far from the light-transmissive body 4 falls within a range of 30%. More preferably, the concentration of the diffusing agent being "substantially even" means that, in the fluorescent material layer 3 being divided into three equal parts in the direction parallel to the main surface of the light-transmissive body 4 and divided into two equal parts in the perpendicular direction, that is, into six regions in total, the difference in concentration of the diffusing agent falls within a range of 10%. The diffusing agent may be at least one selected from titanium oxide, barium titanate, aluminum oxide, silicon oxide, zirconium oxide, and magnesium oxide.

The thickness of the fluorescent material layer 3 is from 20 μm to 100 μm inclusive, and preferably from 20 μm to 50 μm inclusive, because the thickness greater than 100 μm tends to reduce the heat releasing property. In view of the heat releasing property, the thinner fluorescent material layer 3 is, the more preferable it is. On the other hand, an excessively small thickness may fail to provide desired chromaticity of emission light, due to the reduced amount of the fluorescent material 9. The thickness of the fluorescent material layer 3 is adjusted to be properly thin in consideration of the foregoing.

The average particle size of the fluorescent material 9 contained in the fluorescent material layer 3 is preferably from 8 μm to 30 μm inclusive, and more preferably from 12 μm to 18 μm inclusive because, while a smaller average particle size is preferable in consideration of the heat releasing property, an excessively small average particle size tends to reduce the luminance. Here, the average particle size of the fluorescent material particles is the volume average particle size, and is the particle size (median size) measured with a laser diffraction particle size analyzer (MASTER SIZER 3000 available from Malvern Instruments Ltd).

In the case where a blue-color light emitting element is used, a representative fluorescent material 9 capable of emitting white-color-based mixed-color light suitably in combination may be, for example, an yttrium-aluminum-garnet-based fluorescent material (a YAG-based fluorescent material). In order to obtain a light emitting device capable of emitting white-color light, the concentration of the fluorescent material 9 contained in the fluorescent material layer 3 is adjusted to attain white color. The concentration of the fluorescent material 9 in the entire fluorescent material layer 3 may be, for example, from 30% to 70% inclusive.

Further, employing a blue-color light emitting element as the light emitting element 2 and employing a YAG-based fluorescent material and a nitride-based fluorescent material containing a large amount of red-color components as the fluorescent material 9, light in amber color can be emitted. Amber color is the region formed by a long wavelength region in yellow color and a yellow-red short wavelength region in JIS standard Z8110, or a chromaticity range between a yellow-color region and a yellow-red short wavelength region in safety color JIS standard Z9101. For example, the region positioned in the range from 580 nm to 600 nm inclusive in terms of dominant wavelength corresponds to amber color. A fluorescent material 9 that causes light emission in amber color is often low in light conversion efficiency, and an increased fluorescent material concentration is desired in order to obtain an intended hue. Further, there is also a concern that such a fluorescent material 9 generates heat by a greater amount than other fluorescent material. The present embodiment is capable of releasing heat by increasing the concentration of the fluorescent material 9 in the region near the light emitting element 2 of the fluorescent material layer 3. Accordingly, the fluorescent material 9 that causes light emission in amber color can also be suitably used.

(Light-Transmissive Body)

The light-transmissive body 4 is a member that supports the fluorescent material layer 3 formed on its surface. The light-transmissive body 4 may be a plate-like body made of a light-transmissive material such as glass and resin. The glass may be, for example, borosilicate glass or fused quartz. Further, the resin may be, for example, silicone resin or epoxy resin. The light-transmissive body 4 should have a thickness that keeps mechanical strength in manufacturing processes and provides mechanical strength enough to support the fluorescent material layer 3. Further, since an excessively thick light-transmissive body 4 hinders a reduction in size of the light emitting device and reduces the heat releasing property, the light-transmissive body 4 is preferably set to have a proper thickness. The main surface of the light-transmissive body 4 (the main surface where the fluorescent material layer 3 is formed) is preferably greater than the upper surface of the light emitting element 2. This is for allowing the fluorescent material layer 3 to be disposed over the entire main surface of the light-transmissive body 4, so that the light-transmissive body 4 equipped with the fluorescent material layer 3 can be disposed on the upper surface of the light emitting element 2 while having the fluorescent material layer 3 surely disposed over the entire upper surface of the light emitting element 2 against any misalignment to some degree. Further, the light-transmissive body 4 may contain a diffusing agent. An increased concentration of the fluorescent material layer 3 tends to invite unevenness in color. Here, existence of a diffusing agent suppresses unevenness in color, and further in luminance. The diffusing agent contained in the light-transmissive body 4 may be made of the material identical to that of the diffusing agent added to the fluorescent material layer 3 as described above.

One of the main surface of the light-transmissive body 4 where the fluorescent material layer 3 is formed and other opposite main surface may be roughened to have fine hubbly shapes. The roughened main surface of the light-transmissive body 4 where the fluorescent material layer 3 is formed facilitates forming and fixing the fluorescent material layer 3. On the other hand, the other roughened main surface opposite to the main surface where the fluorescent material layer 3 is formed actively scatters the output light from the light emission surface, whereby variations in luminance or color is further suppressed.

(Adhesive Layer)

The wavelength conversion member 30 is preferably joined (or bonded) to the light emitting element 2 having the adhesive layer 5 interposed between the light emitting element 2 and the fluorescent material layer 3. In the case where the adhesive layer 5 is used, an adhesive agent forming the adhesive layer 5 is preferably a material capable of guiding the output light from the light emitting element 2 to the fluorescent material layer 3, and optically coupling between the light emitting element 2 and the fluorescent material layer 3. A specific example thereof may be organic resin such as silicone resin, epoxy resin, phenolic resin, and polyimide resin. Among others, silicone resin is preferable. The thinner adhesive layer 5, the more preferable it is, because a reduction in thickness of the adhesive layer 5 improves the heat releasing property and output of light from the light emitting device by virtue of reduced loss in light transmitting through the adhesive layer 5.

The adhesive layer 5 is preferably disposed not only between the light emitting element 2 and the fluorescent material layer 3, but also at the lateral surface of the light emitting element 2, because the outer surface of the adhesive layer 5 disposed at the lateral surface of the light emitting element 2 can reflect output light from the lateral surface of the light emitting element 2 and cause the light to enter the fluorescent material layer 3. This improves the wavelength conversion efficiency of the fluorescent material. In particular, as shown in FIG. 2, at the lateral surface of the light emitting element 2, in a cross-sectional view taken in the vertical direction: the adhesive agent preferably extends to the corner formed between the lateral surface of the light emitting element 2 and the surface, positioned on the light emitting element side, of the fluorescent material layer 3 protruding from the upper surface of the light emitting element 2; and the extending adhesive layer 5 preferably has a triangular cross section in which the thickness of the adhesive layer 5 becomes smaller in the lower direction of the light emitting element 2. Further, preferably part of the light reflecting member 6 is disposed so as to be in contact with the adhesive layer 5 having the triangular cross section, and the part of the light reflecting member 6 is tapered. Thus, the output light from the lateral surface of the light emitting element 2 is reflected at the interface between the adhesive layer 5 having the triangular cross section and the tapered light reflecting member 6. Further, the fluorescent material layer 3 being larger than the upper surface of the light emitting element 2 in area facilitates entry of light into the outer circumference of the fluorescent material layer 3 protruding outside the upper surface of the light emitting element 2. This further improves the light emission luminance of the light emitting device 100. Such protruding of the adhesive layer 5 may be formed by adjusting the amount of the adhesive agent bonding the wavelength conversion member 30 to the upper surface of the light emitting element 2, so that the extra adhesive agent not being required for the bonding to the upper surface of the light emitting element 2 protrudes to the lateral surface of the light emitting element 2.

Further, preferably the binder of the fluorescent material layer 3 and the main material of the adhesive agent of the adhesive layer 5 are of the same type (preferably, the same material). For example, when silicone resin is used as the binder of the fluorescent material layer 3, preferably silicone resin is also used as the adhesive agent of the adhesive layer 5. This reduces the difference in index of refraction between the fluorescent material layer 3 and the adhesive layer 5, and therefore increases the input light from the adhesive layer 5 to the fluorescent material layer 3.

(Semiconductor Element)

Separately from the light emitting element 2, the semiconductor element 8 may be disposed on the substrate 1 adjacent to the light emitting element 2. Such a semiconductor element 8 may be, other light emitting element that is not intended to contribute to light emission of the light emitting device 100, a transistor for controlling the light emitting element 2, or a protective element described in the following. The protective element is an element for protecting the light emitting element 2 from mechanical breakdown or a reduction in performance by application of excessive voltage. The protective element is specifically formed by a Zener diode that is energized by being applied with voltage of a predetermined value or greater. Similarly to the light emitting element 2, the protective element is the semiconductor element 8 having a p-electrode and an n-electrode, and electrically connected in anti-parallel relative to the p-electrode and the n-electrode of the light emitting element 2, that is, the n-electrode and the p-electrode of the light emitting element 2 are respectively electrically connected by the electrically conductive member 7 to the p-electrode and the n-electrode of the protective element. Similarly to the light emitting element 2, with the protective element also, the electrodes of the protective element can be joined to the wiring of the substrate 1 via the electrically conductive member 7, by having the electrodes of the protective element opposed to the electrically conductive member 7 and applying heat, ultrasound, and load.

Note that, the height of the semiconductor element 8 when disposed on the substrate 1 is preferably lower than the total height of the light emitting element 2, the fluorescent material layer 3, and the light-transmissive body 4. This facilitates covering the semiconductor element 8 with the light reflecting member 6.

(Light Reflecting Member)

The light reflecting member 6 is disposed as necessary so as to cover at least part of the lateral surface of the light emitting element 2 and at least part of the lateral surface of the wavelength conversion member 30, in order to enhance the luminance at the front surface of the light emitting device 100. In the case where the light reflecting member 6 is used, the material thereof is preferably an insulating material. Further, in order to reliably obtain the strength of a certain level, for example, thermosetting resin, thermoplastic resin or the like can be employed. More specifically, the material may be silicone resin, epoxy resin, BT resin, PPA or phenolic resin. Further, dispersing, in such resin being the base member, powder of a material that is less prone to absorb light from the light emitting element 2 and exhibits a great difference in index of refraction from the resin being the base member (for example, the material identical to the above-described diffusing agent added to the fluorescent material layer 3) achieves efficient reflection of light.

The light emitting device 100 can be filled with the material forming the light reflecting member 6 using, for example, a resin discharging device that is arbitrarily shiftable (movable) relative to the substrate 1 on the upper side of the fixed substrate 1. That is, for example, by the resin discharging device filled with resin moving while discharging the liquid resin from a nozzle at its tip, the material of the light reflecting member 6 is injected beside the light emitting element 2 and the semiconductor element 8. The moving speed of the resin discharging device can be adjusted as appropriate in accordance with the viscosity or temperatures of the employed resin. The discharging amount can be adjusted by stabilizing pressure or the like in the discharging mode. The viscosity of the material of the light reflecting member 6 is 0.35 Pa·s to 13.0 Pa·s, preferably 3.0 Pa·s to 5.5 Pa·s at room temperatures (20±5° C.).

(Electrically Conductive Member)

In the case where the electrically conductive member 7 is used, the electrically conductive member 7 may be bumps. The material of the bumps may be Au or alloy of Au. Other electrically conductive member 7 may be eutectic solder (Au—Sn), Pb—Sn, lead-free solder or the like. Note that, while FIG. 2 shows the example where the electrically conductive member 7 is bumps, the electrically conductive member 7 is not limited to bumps and may be, for example, electrically conductive paste.

(Underfill)

The underfill is a member for protecting the light emitting element 2, the semiconductor element 8 which is a separate member from the light emitting element 2, the electrically conductive member 7 and the like disposed on the substrate 1 from dust, moisture, shock from an external source and the like. The underfill can be disposed at the clearance between the substrate 1 and the light emitting element 2 and the semiconductor element 8, and the clearance between the electrically conductive member 7 and other electrically conductive member 7.

The material of the underfill may be, for example, silicone resin, epoxy resin, urea resin or the like. Further, in addition to such a material, a coloring agent, a diffusing agent, filler, a fluorescent material and the like may be contained as necessary.

3. Method of Manufacturing Wavelength Conversion Member

FIG. 3 and FIGS. 4A to 4C are schematic cross-sectional views showing a method of manufacturing the wavelength conversion member 30.

Fluorescent material paste 3A containing the fluorescent material 9 and the binder is disposed on one main surface of the light-transmissive body 4. At least one of the main surface of the light-transmissive body 4 where the fluorescent material layer 3 is formed and other opposite main surface may be previously roughened by etching, laser work or the like. This suppresses variations in light emission of the light emitting device 100.

The fluorescent material layer 3 may be formed on the surface of the light-transmissive body 4 by printing, for example. While the method of forming the fluorescent material layer 3 is not limited to printing, a formation method by printing is exemplarily shown in the following.

The fluorescent material paste 3A containing the fluorescent material 9, the binder, and solvent is prepared. The fluorescent material paste 3A is applied onto the surface (the main surface) of the light-transmissive body 4. The binder may be organic resin binder such as silicone resin, epoxy resin, phenolic resin, and polyimide resin, or an inorganic binder such as glass. Further, the fluorescent material paste 3A may contain, for example, a diffusing agent such as titanium oxide, barium titanate, aluminum oxide, or silicon oxide as necessary. Application of the fluorescent material paste 3A may be performed by, for example, in the following manner. That is, the fluorescent material paste 3A is supplied on a screen disposed on the light-transmissive body 4. Thereafter, a squeegee is shifted to cause the fluorescent material paste 3A to transmit through the screen, whereby the fluorescent material paste 3A of a predetermined thickness is applied onto the light-transmissive body 4. Thus, the fluorescent material paste 3A can be applied to have an even thickness.

Figure 3:
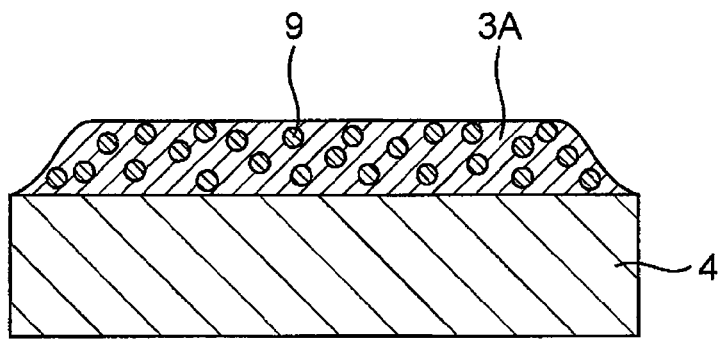
FIG. 3 is a schematic cross-sectional view showing a method of manufacturing the wavelength conversion member.
Figure 4A:
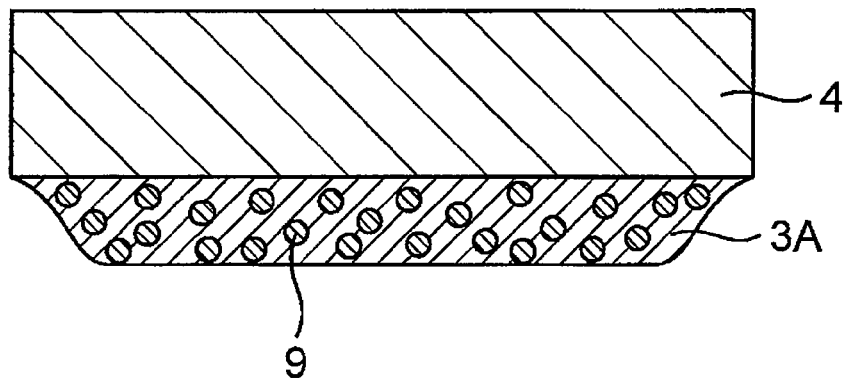
FIGS. 4A to 4C are schematic cross-sectional views showing the method of manufacturing the wavelength conversion member.
Figure 4B:
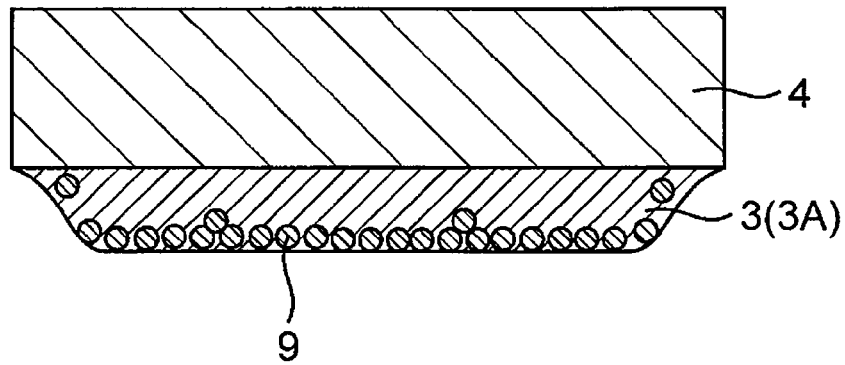
Figure 4C:
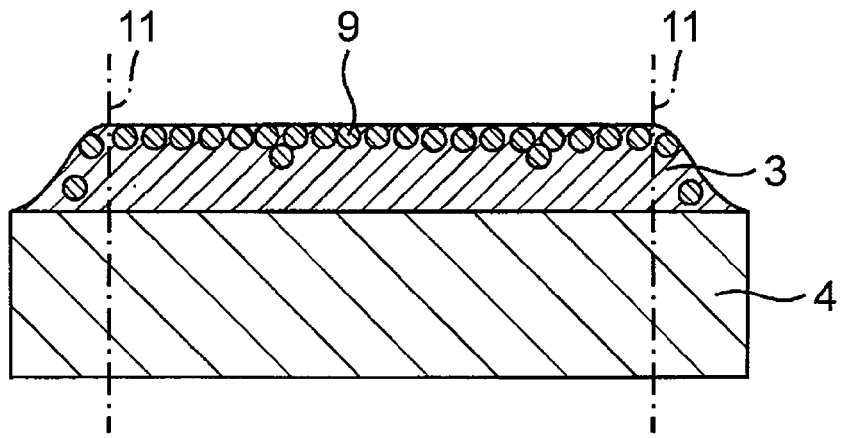

As shown in FIG. 3, the fluorescent material paste 3A is applied on one main surface of the light-transmissive body 4. Thereafter, as shown in FIG. 4A, the main surface of the light-transmissive body 4 where the fluorescent material paste 3A is applied is oriented face-down. That is, the light-transmissive body 4 is turned over so that the two main surfaces (i.e. top and bottom main surfaces) of the light-transmissive body 4 change places. Then, as shown in FIG. 4B, in the fluorescent material paste 3A, the fluorescent material 9 is settled on the side opposite to the surface being in contact with the light-transmissive body 4. This settlement may be carried out by natural sedimentation using the gravity acting on the fluorescent material. Thus, the concentration of the fluorescent material 9 in the fluorescent material layer 3 formed on the main surface, which opposes to the light emitting element 2, of the light-transmissive body 4 can be increased on the side near the light emitting element 2 than on the side near the light-transmissive body 4 in the direction perpendicular to the main surface. In the state where the desired distribution of the fluorescent material 9 is attained in the fluorescent material paste 3A (preferably, in the state where the fluorescent material 9 has been completely settled), the binder of the fluorescent material paste 3A is cured, to obtain the fluorescent material layer 3. This provides the concentration of the fluorescent material 9 being substantially uniform (substantially even) in the direction parallel to the main surface of the light-transmissive body 4. The curing the binder is carried out by any proper method such as drying, heating, ultraviolet irradiation or the like in accordance with the type of the binder.

The wavelength conversion member 30 according to an embodiment of the present disclosure can be obtained through the above-described method. However, in some cases, the fluorescent material layer 3 formed on the light-transmissive body 4 in this way may fail to attain the desired concentration distribution of the fluorescent material 9 around the outer circumference of the fluorescent material layer 3 (hereinafter referred to as "the circumference") in a plan view as seen from the direction perpendicular to the main surface of the light-transmissive body 4 where the fluorescent material layer 3 is formed. In particular, when the fluorescent material layer 3 is formed by printing, as shown in FIG. 3, the fluorescent material layer 3 may become thinner toward the circumference. Thus, the fluorescent material distribution state may differ between the site distanced from the circumference and the circumference, and particles of the fluorescent material may be disposed at undesired positions. Such a wavelength conversion member disadvantageously invites chromaticity shift. In order to solve this problem, the method of manufacturing the conversion member 30 preferably further includes selecting from an inner region of the fluorescent material layer 3 excluding the circumference (the inner region excluding the circumference of the fluorescent material layer 3 and the circumference of the light-transmissive body 4) in which the fluorescent material distribution is substantially uniform, and cleaving, along cleaving lines 11 in FIG. 4C, the fluorescent material layer 3 and the light-transmissive body 4 to have a predetermined shape. The cleaving provides the wavelength conversion member 30 in which the fluorescent material concentration in the fluorescent material layer 3 is substantially uniform in the direction parallel to the main surface of the light-transmissive body 4. More preferably, adjusting the amount of the fluorescent material and the time of the settlement, and further selecting the site to be cleaved as the wavelength conversion member 30 provide the state as shown in FIG. 1 in which the particles of the fluorescent material are juxtaposed to each other to completely fill the space from the lateral surface of the fluorescent material layer 3 exposed by the cleaving to the opposing lateral surface. Such disposition of the fluorescent material 3 reduces chromaticity shift in the light emitting device 100.

(Variation of Method of Manufacturing Wavelength Conversion Member 30)

Figure 5:
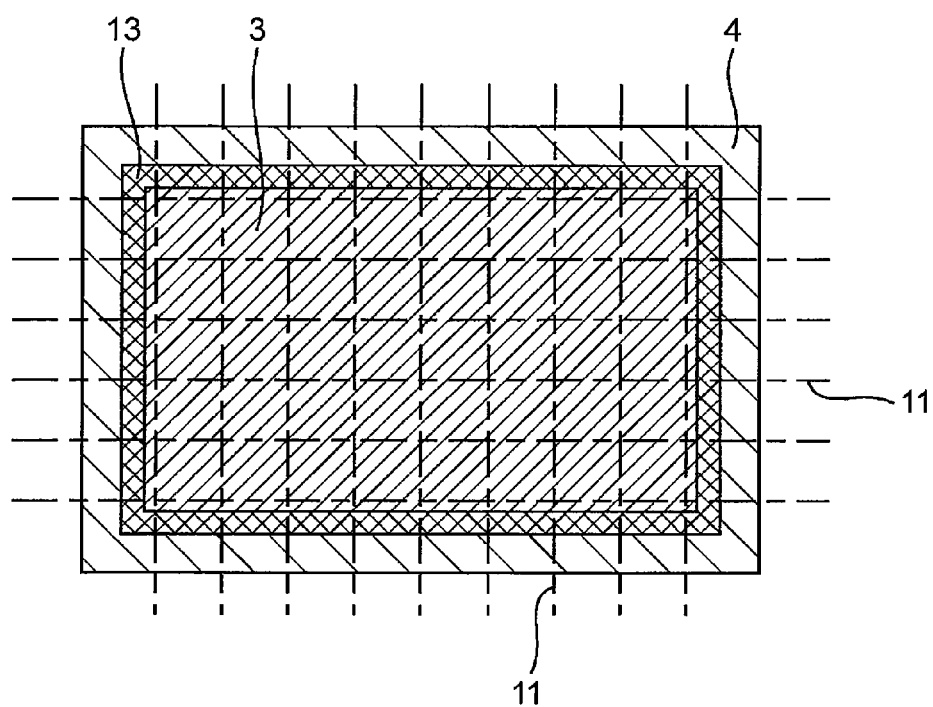
FIG. 5 is a schematic plan view showing a variation of the method of manufacturing the wavelength conversion member.

FIG. 5 is a schematic plan view showing a variation of the method of manufacturing the wavelength conversion member 30. According to the method shown in FIG. 5, a large number of wavelength conversion members 30 can be manufactured more efficiently. Note that, manufacturing conditions not particularly specified may be identical to those described in the foregoing.

The fluorescent material paste 3A is applied onto one main surface of the light-transmissive body 4. Subsequently, the main surface of the light-transmissive body 4 to which the fluorescent material paste 3A is applied is oriented face-down. Then, in the fluorescent material paste 3A, the fluorescent material 9 is settled on the side opposite to the surface being in contact with the light-transmissive body 4. Thus, the concentration of the fluorescent material 9 in the fluorescent material layer 3 formed on the main surface, which opposes to the light emitting element 2, of the light-transmissive body 4 can be increased on the side near the light emitting element 2 than on the side near the light-transmissive body 4 in the direction perpendicular to the main surface, and to be substantially uniform (substantially even) in the direction parallel to the main surface. Subsequently, in the state where the desired distribution of the fluorescent material 9 is obtained in the fluorescent material paste 3A (in the state where the fluorescent material 9 has been settled), the binder of the fluorescent material paste 3A is cured, to obtain the fluorescent material layer 3.

Thereafter, dicing, that is, cleaving the wavelength conversion member 30 along cleaving lines 11 shown in FIG. 5 provides a plurality of wavelength conversion members 30 having a predetermined shape.

Note that, in the dicing, preferably the wavelength conversion member 30 (the fluorescent material layer 3 and the light-transmissive body 4) is cleaved in the above-described inner region excluding the circumference 13 so as to exclude the circumference 13 of the fluorescent material layer 3 from each singulated wavelength conversion member 30, and singulated to have a predetermined shape. Similarly to the wavelength conversion member 30 described in the foregoing, selecting the region in which fluorescent material distribution is substantially uniform and cleaving the fluorescent material layer 3 and the light-transmissive body 4 to have a predetermined shape reduces chromaticity shift. Further, out of the plurality of wavelength conversion members obtained by the cleaving, selecting the wavelength conversion members in which the fluorescent material distribution in the fluorescent material layer 3 is substantially uniform and manufacturing a plurality of light emitting devices using the selected wavelength conversion members, the light emitting devices with uniform optical characteristics are obtained.

The concentration of the fluorescent material 9 in the direction parallel to the main surface of the light-transmissive body 4 (the main surface where the fluorescent material layer 3 is formed) may be measured in the following manner, for example. That is, before the dicing, the fluorescent material layer 3 is irradiated with excitation light of the fluorescent material 9, and the concentration distribution of the fluorescent material 9 in the parallel direction is estimated from the chromaticity of emitted light.

4. Method of Manufacturing Light Emitting Device

In the following, a description will be given of a method of manufacturing the light emitting device 100 using the wavelength conversion member 30 obtained in the manner described above.

The method includes providing the light emitting element 2, and joining the wavelength conversion member 30 on the light emitting element 2 to each other so that the fluorescent material layer 3 of the wavelength conversion member 30 is oriented toward the light emitting element 2.

The providing the light emitting element 2 may be performed by, for example, flip-chip mounting the light emitting element 2, and the semiconductor element 8 as necessary, on the substrate 1 provided with an electrically conductive pattern in which a positive electrode and a negative electrode are isolated from each other.

In the joining the wavelength conversion member 30 on the light emitting element 2 so that the fluorescent material layer 3 of the wavelength conversion member 30 is oriented toward the light emitting element 2, the fluorescent material layer 3 and the light-transmissive body 4 which are integrally formed (i.e., the wavelength conversion member 30) may be joined to the upper surface of the light emitting element 2 via the adhesive layer 5. The adhesive layer 5 bonds the fluorescent material layer 3 and the light emitting element 2 to each other. Further, the fluorescent material layer 3 may be formed to be greater than the upper surface of the light emitting element 2 in area. In this case, the fluorescent material layer 3 may be joined to the light emitting element 2 so as to have an exposed portion which is not covered with the upper surface of the light emitting element 2. Accordingly, when the fluorescent material layer 3 is disposed on the upper surface of the light emitting element 2, the adhesive agent protruding from the upper surface of the light emitting element 2 attaches to the lateral surface of the light emitting element 2 and the exposed portion of the fluorescent material layer 3, to form a protruding portion of the adhesive layer 5 at the lateral surface of the light emitting element 2. The adhesive layer 5 at the lateral surface of the light emitting element 2 may have a triangular cross section in which the thickness of the adhesive layer 5 becomes smaller in the lower direction of the light emitting element 2, in a cross-sectional view taken in the vertical direction. Thus, the output light from the lateral surface of the light emitting element 2 is reflected at angles of a wide range at the adhesive layer 5 of the lateral surface. This facilitates entry of light into also the outer circumference of the fluorescent material layer 3 and further improves luminance of the light emitting device 100. Further, in manufacturing processes, the adhesive agent before bonding may be applied onto the fluorescent material layer 3, or onto the upper surface of the light emitting element 2. Still further, at this time, part of the adhesive agent is preferably cause to extend to the corner formed by the lateral surface of the light emitting element 2 and the surface of the fluorescent material layer 3 on the light emitting element 2 side, in order for part of the adhesive layer 5 protruding to the lateral surface of the light emitting element 2 to have a triangular cross section.

The light reflecting member 6 may be disposed as necessary. The light reflecting member 6 is disposed along the lateral surface of the light emitting element 2 and the lateral surface of the wavelength conversion member 30. The light reflecting member 6 is for reflecting light output from the light emitting element 2. The light reflecting member 6 may cover the entire semiconductor element 8.

The clearance between the substrate 1 and the light emitting element 2 and the semiconductor element 8 and the clearance between the electrically conductive member 7 and other electrically conductive member 7 may be filled with underfill.

INDUSTRIAL APPLICABILITY

The light emitting device according to an embodiment of the present disclosure is applicable to an automotive light source, a display device, a lighting device, a display, backlight of a liquid crystal display and the like.

What is claimed is:

1. A method of manufacturing a light emitting device, comprising:
   manufacturing a wavelength conversion member according to a method of manufacturing a wavelength conversion member comprising:
   disposing a fluorescent material paste containing a fluorescent material and a binder on a surface of a light-transmissive body;
   orienting face-down the surface where the fluorescent material paste is disposed, to settle the fluorescent material in the fluorescent material paste on a side opposite to another side of the fluorescent material paste, the another side being in contact with the light-transmissive body; and
   curing the binder in a state where the fluorescent material has been settled, to form a fluorescent material layer;
   providing a light emitting element; and
   joining the light emitting element and the wavelength conversion member to each other so that the fluorescent material layer is oriented toward the light emitting element.

2. The method of manufacturing the light emitting device according to claim 1, further comprising providing a light reflecting member to cover at least part of a lateral surface of the light emitting element and at least part of a lateral surface of the wavelength conversion member.

3. The method of manufacturing the light emitting device according to claim 1, wherein the light emitting element and the wavelength conversion member are joined to each other via an adhesive agent.

4. The method of manufacturing the light emitting device according to claim 1, further comprising cleaving the fluorescent material layer and the light-transmissive body to have a predetermined shape out of an inner region of the fluorescent material layer and to exclude a circumference portion of the fluorescent material layer.

5. The method of manufacturing the light emitting device according to claim 1, wherein the fluorescent material paste is disposed on the surface by printing.

6. The method of manufacturing the light emitting device according to claim 1, wherein at least one of the light-transmissive body and the binder contains a diffusing agent.

7. The method of manufacturing the light emitting device according to claim 1, wherein the light-transmissive body is a glass material.

8. The method of manufacturing the light emitting device according to claim 1, further comprising roughening at least one of the surface and another surface opposite to the surface of the light-transmissive body.

* * * * *